(12) United States Patent
Kuwabara

(10) Patent No.: US 11,908,773 B2
(45) Date of Patent: Feb. 20, 2024

(54) ELEMENT MODULE

(71) Applicant: TOSHIBA MITSUBISHI-ELECTRIC INDUSTRIAL SYSTEMS CORPORATION, Chuo-ku (JP)

(72) Inventor: Kento Kuwabara, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 309 days.

(21) Appl. No.: 17/291,441

(22) PCT Filed: Jul. 30, 2019

(86) PCT No.: PCT/JP2019/029809
§ 371 (c)(1),
(2) Date: May 5, 2021

(87) PCT Pub. No.: WO2021/019682
PCT Pub. Date: Feb. 4, 2021

(65) Prior Publication Data
US 2022/0005746 A1    Jan. 6, 2022

(51) Int. Cl.
*H01L 23/48* (2006.01)
*H01L 25/18* (2023.01)

(52) U.S. Cl.
CPC .............. *H01L 23/48* (2013.01); *H01L 25/18* (2013.01)

(58) Field of Classification Search
CPC ................................ H01L 23/48; H01L 25/18
See application file for complete search history.

(56) References Cited

U.S. PATENT DOCUMENTS

| | | | |
|---|---|---|---|
| 4,514,437 A * | 4/1985 | Nath | H01J 37/32422 136/258 |
| 6,114,201 A * | 9/2000 | Wu | H01L 28/87 438/254 |
| 7,957,135 B2 * | 6/2011 | Ohkouchi | H01L 25/18 165/185 |
| 11,121,440 B2 * | 9/2021 | Takabayashi | H01M 50/627 |
| 2004/0089934 A1 * | 5/2004 | Shimoida | H01L 25/071 257/E25.015 |

(Continued)

FOREIGN PATENT DOCUMENTS

JP    2006-42500 A    2/2006
JP    2006-520523 A    9/2006

(Continued)

OTHER PUBLICATIONS

International Search Report dated Oct. 15, 2019 in PCT/JP2019/029809 filed on Jul. 30, 2019, 2 pages.

(Continued)

*Primary Examiner* — Nicholas J Tobergte
(74) *Attorney, Agent, or Firm* — Oblon, McClelland, Maier & Neustadt, L.L.P.

(57) ABSTRACT

An element module includes an element, a plurality of conductive members, and a spacer member. The plurality of conductive members are connected to the element and arranged in a predetermined direction. The spacer member is disposed between two conductive members of the plurality of conductive members adjacent to each other in the predetermined direction and is in contact with parts of the two conductive members.

3 Claims, 3 Drawing Sheets

(56) References Cited

U.S. PATENT DOCUMENTS

2006/0231285 A1  10/2006  Bisson et al.
2019/0237742 A1* 8/2019  Takabayashi ....... H01M 50/147

FOREIGN PATENT DOCUMENTS

| JP | 2011-108817 A | 6/2011 |
|----|---------------|--------|
| JP | 2015-2141 A   | 1/2015 |
| WO | WO 2016/204306 A1 | 12/2016 |

OTHER PUBLICATIONS

Indian Office Action dated Mar. 25, 2022 in Indian Patent Application No. 202117021734, 6 pages.

\* cited by examiner

ELEMENT MODULE

TECHNICAL FIELD

The present invention relates to an element module.

BACKGROUND ART

Conventionally, a stator of a rotating electrical machine provided with a plurality of bus bars which are stacked on each other to form a coil end has been disclosed.

Conventionally, a battery unit provided with a plurality of bus bars which are joined to a plurality of cells and arranged at predetermined intervals in a cell stacking direction has been disclosed.

When a plurality of plate-shaped bus bars are stacked on each other without a gap, it may be difficult to improve the cooling performance of the entire stacked body.

When a plurality of bus bars are arranged at predetermined intervals in a cell stacking direction, it may be difficult to improve the positioning accuracy of the plurality of bus bars in the cell stacking direction.

CITATION LIST

Patent Literature

[Patent Literature 1]
Japanese Unexamined Patent Application, First Publication No. 2006-42500
[Patent Literature 2]
Japanese Unexamined Patent Application, First Publication No. 2015-2141

SUMMARY OF INVENTION

Technical Problem

An object of the present invention is to provide an element module capable of improving the positioning accuracy of conductive members and ensuring a desired cooling performance.

Solution to Problem

An element module of an embodiment includes an element, three or more conductive members, and a spacer member. The three or more conductive members are arranged in a predetermined direction, and the element is connected to a conductive member of the three or more conductive members positioned in an end portion thereof in the predetermined direction. The spacer member is disposed between two conductive members of the three or more conductive members adjacent to each other in the predetermined direction and is in contact with parts of the two conductive members.

DESCRIPTION OF EMBODIMENTS

Hereinafter, an element module according to an embodiment will be described with reference to the accompanying drawings.

Figure 1:
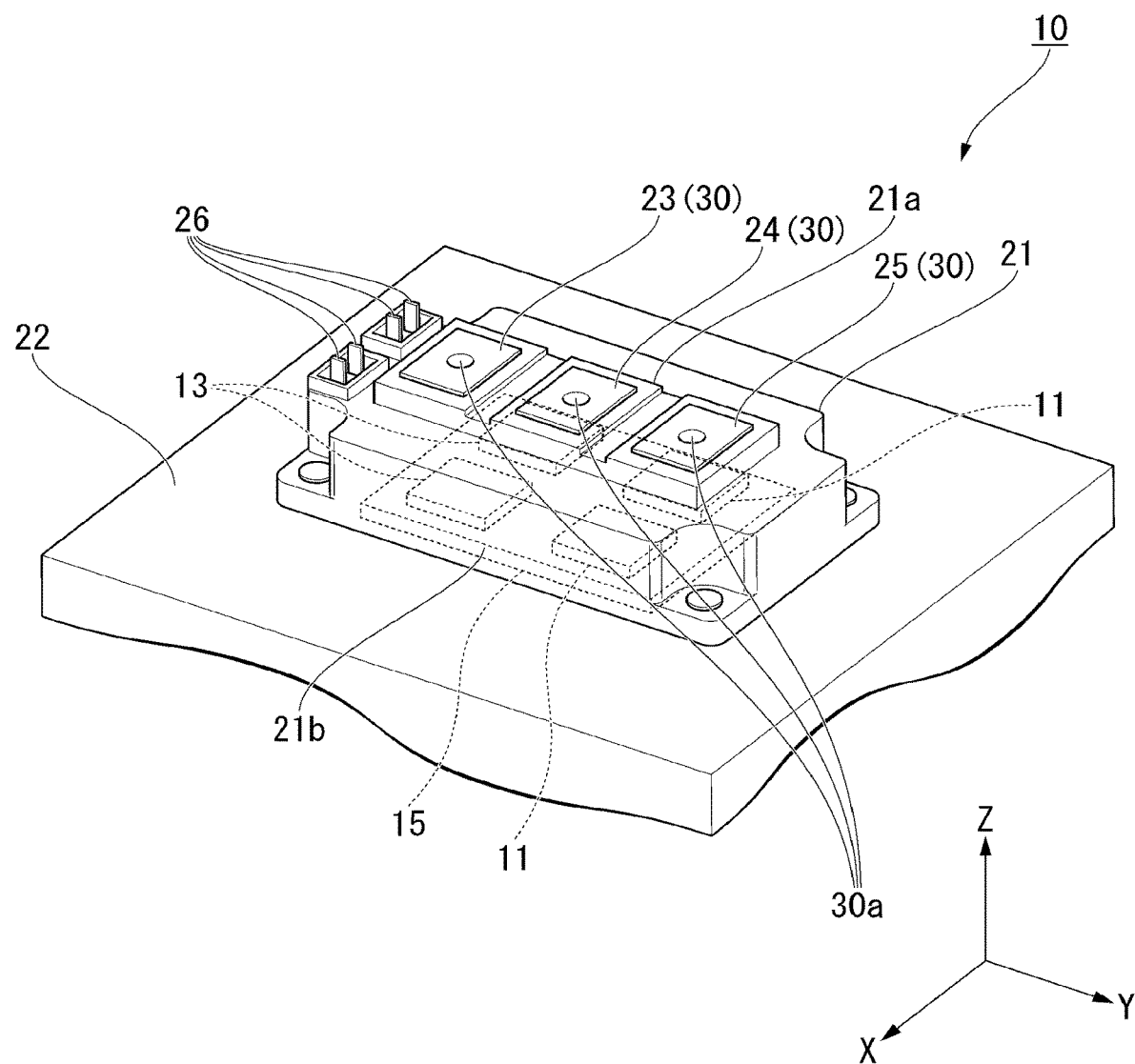
FIG. 1 is a perspective view of an element module according to an embodiment.
Figure 2:
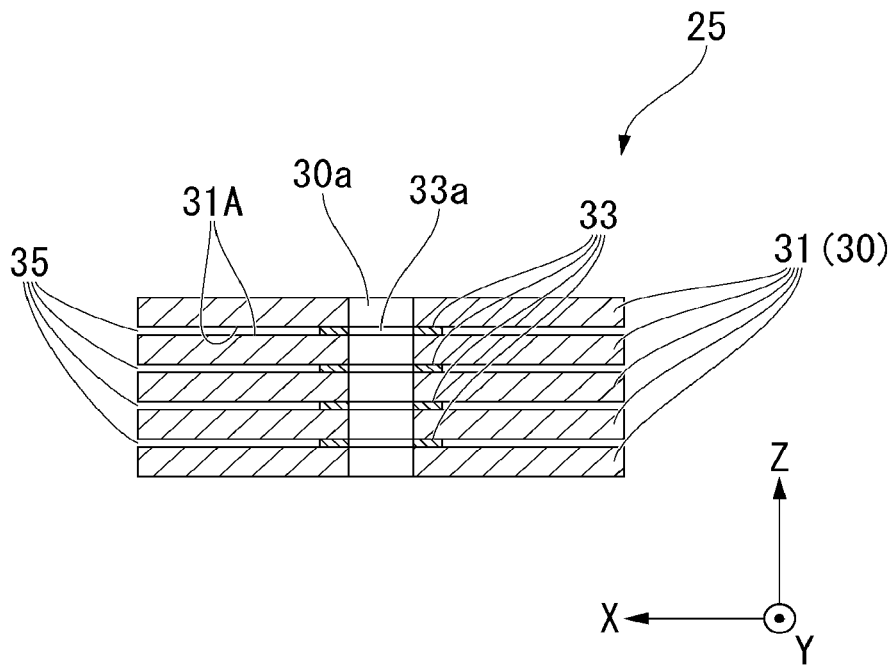
FIG. 2 is a cross-sectional view, which is cut in an X-Z plane, of an input-output terminal of the element module according to the embodiment.

FIG. 1 is a perspective view of an element module 10 of the embodiment. FIG. 2 is a cross-sectional view, which is cut in an X-Z plane, of an input-output terminal 25 of the element module 10 of the embodiment.

In the following, X-axis, Y-axis, and Z-axis directions orthogonal to each other in a three-dimensional space are directions parallel to the respective axes. For example, a left-right direction of the element module 10 is parallel to the X-axis direction. A front-back direction of the element module 10 is parallel to the Y-axis direction. A vertical direction (thickness direction) of the element module 10 is parallel to the Z-axis direction.

As shown in FIG. 1, the element module 10 of the embodiment includes at least one semiconductor element. For example, the element module 10 includes two switching elements which are connected to each other through a bridge connection. The two switching elements are transistors 11 such as Insulated Gate Bipolar Transistors (IGBTs) which are disposed so that one is in a high-side arm and one is in a matched low-side arm. The element module 10 includes diodes 13 each of which is connected between a collector and an emitter of the respective transistor 11 in a forward direction from the emitter to the collector. The two transistors 11 and the two diodes 13 are mounted on a substrate 15. The substrate 15 is a plate member in which an insulating portion made of resin or ceramics and a conductive portion made of copper or the like are integrated. The element module 10 is a power module that forms a bridge circuit of an inverter that performs conversion between DC power and AC power.

The element module 10 includes, for example, a housing 21, a heat sink 22, a positive electrode terminal 23, a negative electrode terminal 24, the input-output terminal 25, and a control terminal 26.

The outer shape of the housing 21 is formed, for example, in a rectangular box shape. The housing 21 is made of an electrically insulating resin material or the like. For example, the housing 21 accommodates the two transistors 11 and the two diodes 13 thereinside. The housing 21 holds the terminals 23, 24, 25 and 26 in a state where the terminals 23, 24, 25 and 26 are exposed to outside from an upper portion 21a of the housing 21. The substrate 15 on which the two transistors 11 and the two diodes 13 are mounted is exposed to outside from a lower portion 21b of the housing 21.

The heat sink 22 is fixed to the lower portion 21b of the housing 21. The heat sink 22 is in contact with the substrate 15 which is exposed from the lower portion 21b of the housing 21.

Each of the positive electrode terminal 23, the negative electrode terminal 24, and the input-output terminal 25 is formed, for example, of conductive plates 30. The positive electrode terminal 23 is connected to the collector of the transistor 11 in the high-side arm. The negative electrode terminal 24 is connected to the emitter of the transistor 11 in the low-side arm. The input-output terminal 25 is connected to the emitter of the transistor 11 in the high-side arm and the collector of the transistor 11 in the low-side arm which are connected to each other. For example, a bolt insertion hole 30a is formed in the conductive plate 30 forming each of the positive electrode terminal 23, the negative electrode terminal 24, and the input-output terminal 25, and a bolt (not shown) for fixing an external conductive member (not shown) is inserted into the bolt insertion hole 30a.

The input-output terminal 25 is, for example, a terminal for input/output of an alternating current (AC). As shown in FIG. 2, the input-output terminal 25 includes, for example, a plurality of AC conductive plates 31, and at least one spacer member 33.

The AC conductive plate 31, which is the conductive plate 30 forming the input-output terminal 25, is a so-called bus bar, and is made of a metal such as copper. The plurality of AC conductive plates 31 are arranged in a plate thickness direction thereof.

The plate thickness direction is, for example, the Z-axis direction.

The outer shape of the spacer member 33 is formed, for example, in an annular plate shape smaller than the AC conductive plate 31. The spacer member 33 is made of a conductive metal material. The spacer member 33 is disposed between two AC conductive plates 31 adjacent to each other in the plate thickness direction. The spacer member 33 is sandwiched by the two AC conductive plates 31 from both sides in the plate thickness direction. The spacer member 33 is in contact with parts of facing surfaces 31A of the two AC conductive plates 31 adjacent to each other in the plate thickness direction, and thereby a gap 35 is formed between parts of the facing surfaces 31A other than the parts with which the spacer member 33 is in contact. A through hole 33a is formed in the spacer member 33 so as to face and communicate with the bolt insertion hole 30a of the AC conductive plate 31. The spacer member 33 is, for example, a so-called washer.

As is described above, according to the element module 10 of the embodiment, as the plurality of AC conductive plates 31 of the input-output terminal 25 are stacked on each other via the spacer member 33, it is possible to easily improve the positioning accuracy of the AC conductive plates 31 in the stacking direction. As the spacer member 33 is in contact with only parts of the facing surfaces 31A of the two AC conductive plates 31 adjacent to each other in the stacking direction, it is possible to improve the heat dissipation and cooling performance of the AC conductive plates 31 through the gap 35 formed between parts of the facing surfaces 31A other than the parts with which the spacer member 33 is in contact.

Figure 3:
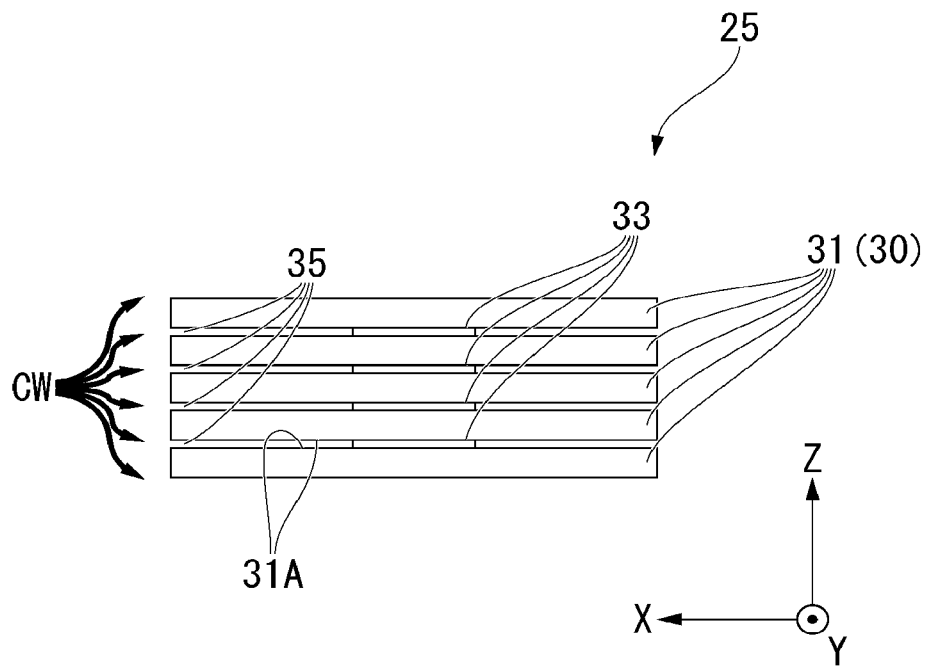
FIG. 3 is a side view of the input-output terminal when viewed in a Y-axis direction.

FIG. 3 is a side view of the input-output terminal 25 of the element module 10 of the embodiment when viewed in the Y-axis direction.

As shown in FIG. 3, in the element module 10 of the embodiment, a refrigerant CW such as cooling air passes through the gap 35 between the two AC conductive plates 31 adjacent to each other in the stacking direction, and thereby the heat dissipation and cooling performance of the plurality of AC conductive plates 31 are improved. For example, compared with a case where a gap 35 is not formed between two AC conductive plates 31 adjacent to each other in the stacking direction, the surface area of the AC conductive plate 31 in contact with the refrigerant CW is increased, and the cooling performance can be improved.

For example, compared with a case where an input-output terminal 25 is formed by a single conductive plate having the same thickness as a stacked body of the plurality of AC conductive plates 31, as the thickness of each AC conductive plate 31 becomes thinner, the skin effect and the inductance can be reduced. As the thickness of each AC conductive plate 31 becomes thinner, the flexibility of the input-output terminal 25 can be improved, the pressure acting on an external conductive member can be reduced, and the contact resistance with the external conductive member can be reduced.

For example, even if a case where, due to the minimization of the substrate 15 by integrating the insulating portion and the conductive portion, the temperature of the input-output terminal 25 is likely to rise among the terminals 23, 24, and 25 positioned on the opposite side of the heat sink 22, it is possible to suppress the temperature rise by improving the heat dissipation and cooling performance.

Hereinafter, a modified example of the embodiment will be described.

In the embodiment described above, the AC conductive plate 31 and the spacer member 33 of the input-output terminal 25 are formed separately, but it is not limited thereto, and the AC conductive plate 31 and the spacer member 33 may be integrated with each other.

Figure 4:
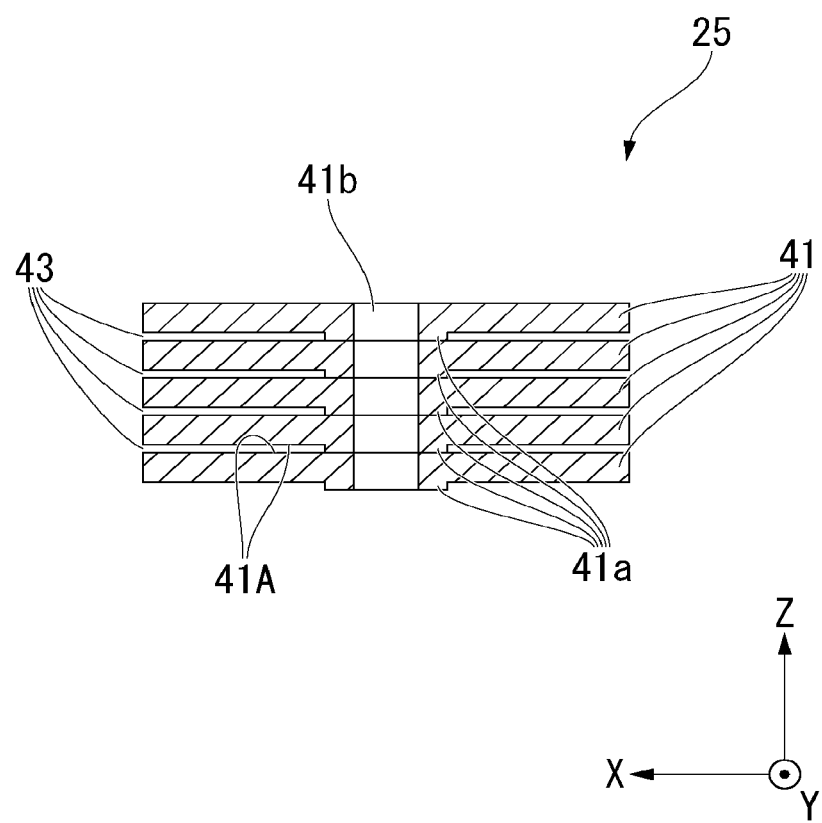
FIG. 4 is a cross-sectional view, which is cut in an X-Z plane, of an input-output terminal of an element module according to a modified example of the embodiment.

FIG. 4 is a cross-sectional view, which is cut in the X-Z plane, of an input-output terminal 25 of an element module 10 of the modified example of the embodiment.

As shown in FIG. 4, the input-output terminal 25 of the element module 10 of the modified example includes AC conductive plates 41 each of which is provided with a protrusion portion 41a, instead of the combination of the AC conductive plates 31 and the spacer members 33 in the above-described embodiment.

The outer shape of the protrusion portion 41a is formed, for example, in a protrusion shape protruding from a first surface of both surfaces in the plate thickness direction of the AC conductive plate 41. A distal end of the protrusion portion 41a is in contact with a second surface of both surfaces in the plate thickness direction of another AC conductive plate 41 adjacent to the AC conductive plate 41. With the protrusion portion 41a, a gap 43 is formed between facing surfaces 41A of two AC conductive plates 41 adjacent to each other in the stacking direction. A bolt insertion hole 41b is formed in the AC conductive plate 41 and the protrusion portion 41a, and a bolt (not shown) for fixing an external conductive member (not shown) is inserted into the bolt insertion hole 41b.

By providing the AC conductive plate 41 provided with the protrusion portion 41a in this manner, instead of the combination of the AC conductive plate 31 and the spacer member 33, it is possible to more easily improve the positioning accuracy of the AC conductive plates 41 in the stacking direction. Further, as the protrusion portion 41a is integrated with the AC conductive plate 41, it is possible to increase the heat dissipation area of the AC conductive plate 41 as a whole. Therefore, it is possible to improve the heat dissipation and cooling performance of the AC conductive plates 41.

In the embodiment described above, the outer shape of the spacer member 33 has an annular plate shape, but it is not limited thereto, and the outer shape of the spacer member 33 may be any of other shapes. For example, the outer shape of the spacer member 33 may have a plurality of protrusions protruding, in the Z-axis direction, from at least one surface of the AC conductive plate 31.

In the embodiment described above, the input-output terminal 25 is formed of a stacked body of the plurality of AC conductive plates 31 and at least one spacer member 33, but it is not limited thereto. All of or at least one of the positive electrode terminal 23, the negative electrode terminal 24 and the input-output terminal 25 may be formed of a stacked body of the plurality of conductive plates 30 and at least one spacer member 33.

In the embodiment described above, an external conductive member (not shown) that is connected to the positive electrode terminal 23, the negative electrode terminal 24, or the input-output terminal 25 may be formed of a stacked body of a plurality of conductive plates and at least one spacer member.

In the embodiment described above, the element module 10 includes the two transistors 11 and the two diodes 13, but it is not limited thereto, and the element module 10 may include an appropriate number of semiconductor elements or other elements. In this case, the number of each of the positive electrode terminal 23, the negative electrode terminal 24 and the input-output terminal 25 is not limited to one, and an appropriate number of terminals for connecting to the elements may be provided.

According to at least one embodiment described above, as the plurality of AC conductive plates 31 or 41 of the input-output terminal 25 are stacked on each other via the spacer member 33 or the protrusion portion 41a, it is possible to easily improve the positioning accuracy of the AC conductive plates 31 or 41 in the stacking direction. As the spacer member 33 or the protrusion portion 41a is in contact with only parts of the facing surfaces 31A or 41A of the two AC conductive plates 31 or 41 adjacent to each other in the stacking direction, it is possible to improve the heat dissipation and cooling performance of the AC conductive plates 31 or 41 through the gap 35 or 43 formed between parts of the facing surfaces 31A or 41A other than the parts with which the spacer member 33 or the protrusion portion 41a is in contact.

While certain embodiments of the invention have been described, these embodiments have been presented by way of examples only and are not intended to limit the scope of the invention. These embodiments can be embodied in a variety of other forms; furthermore, various omissions, substitutions, and changes can be made without departing from the spirit of the present invention. These embodiments and modifications thereof are included in the scope and gist of the invention, and are also included in the invention described in the claims and equivalents thereof.

REFERENCE SIGNS LIST

10 Element module
11 Transistor
13 Diode
15 Substrate
21 Housing
22 Heat sink
23 Positive electrode terminal
24 Negative electrode terminal
25 Input-output terminal
26 Control terminal
31 AC conductive plate
33 spacer member
41 AC conductive plate
41a Protrusion portion

The invention claimed is:

1. An element module comprising:
an element;
three or more conductive plates arranged in a predetermined direction; and
a spacer member disposed between two conductive plates of three or more conductive plates adjacent to each other in the predetermined direction and that is in contact with parts of the two conductive plates,
wherein the element is connected to a conductive plates of the three or more conductive plates positioned in an end portion thereof in the predetermined direction, and
an outer shape of the spacer member has an annular shape.

2. The element module according to claim 1, wherein the spacer member is integrated with the conductive plates.

3. The element module according to claim 2, wherein an outer shape of the spacer member includes a plurality of protrusions protruding, in the predetermined direction, from at least one surface of the conductive plates.

* * * * *